(12) United States Patent
Cheng et al.

(10) Patent No.: US 8,592,785 B2
(45) Date of Patent: Nov. 26, 2013

(54) MULTI-ION BEAM IMPLANTATION APPARATUS AND METHOD

(75) Inventors: Nai-Han Cheng, Hsinchu (TW);
Chin-Hsiang Lin, Hsin-Chu (TW);
Chi-Ming Yang, Hsin-Chu (TW);
Chun-Lin Chang, Jhubei (TW);
Chih-Hong Hwang, New Taipei County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 13/240,951

(22) Filed: Sep. 22, 2011

(65) Prior Publication Data

US 2013/0075623 A1 Mar. 28, 2013

(51) Int. Cl.
*H01J 37/317* (2006.01)

(52) U.S. Cl.
CPC .................. *H01J 37/3171* (2013.01)
USPC .................................................. 250/492.21

(58) Field of Classification Search
USPC .......................................... 250/285, 492.21
See application file for complete search history.

(56) References Cited

U.S. PATENT DOCUMENTS

| | | | |
|---|---|---|---|
| 5,483,122 A | | 1/1996 | Derbenev et al. |
| 5,811,820 A | * | 9/1998 | Kirchner et al. .......... 250/432 R |
| 7,078,712 B2 | * | 7/2006 | Perel et al. ............... 250/492.21 |
| 8,008,175 B1 | * | 8/2011 | Cherekdjian ................. 438/530 |
| 8,409,952 B2 | * | 4/2013 | Parikh et al. .................. 438/259 |
| 2006/0017016 A1 | * | 1/2006 | Tappel ..................... 250/492.21 |
| 2006/0145095 A1 | * | 7/2006 | Olson et al. .............. 250/492.21 |
| 2012/0126147 A1 | * | 5/2012 | Cherekdjian ............ 250/492.21 |
| 2012/0248328 A1 | * | 10/2012 | Renau et al. .................. 250/398 |

OTHER PUBLICATIONS

Qin et al. 'Construction and Applications of a Dual Mass Selected Low Energy Ion Beam System', Oct. 1991, Rev. Sci. Instrum. 62 (10) 2322-2325.*

* cited by examiner

*Primary Examiner* — Jack Berman
*Assistant Examiner* — Eliza Osenbaugh-Stewart
(74) *Attorney, Agent, or Firm* — Haynes and Boone, LLP

(57) ABSTRACT

An multi-ion beam implantation apparatus and method are disclosed. An exemplary apparatus includes an ion beam source that emits at least two ion beams; an ion beam analyzer; and a multi-ion beam angle incidence control system. The ion beam analyzer and the multi-ion beam angle incidence control system are configured to direct the emitted at least two ion beams to a wafer.

20 Claims, 3 Drawing Sheets

MULTI-ION BEAM IMPLANTATION APPARATUS AND METHOD

BACKGROUND

Ion implantation processes are commonly implemented in manufacturing integrated circuit devices. An ion implantation process introduces atoms or molecules, generally referred to as dopants, into a wafer to achieve desired characteristics of the portion of the wafer implanted and/or form a device feature in the wafer, such as a doped feature of an integrated circuit device. Generally, an ion implantation apparatus includes a means for producing an ion beam, means for analyzing the ion beam, means for directing the ion beam toward the wafer, and means for scanning the ion beam across the wafer. It has been observed that conventional ion implantation apparatuses, which produce and scan a single ion beam across the wafer, present ion implant efficiency issues as integrated circuit device technologies progress. For example, the conventional ion implantation apparatuses provide lower than desirable implantation throughput as wafer sizes increase. Accordingly, although existing ion implantation apparatuses and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
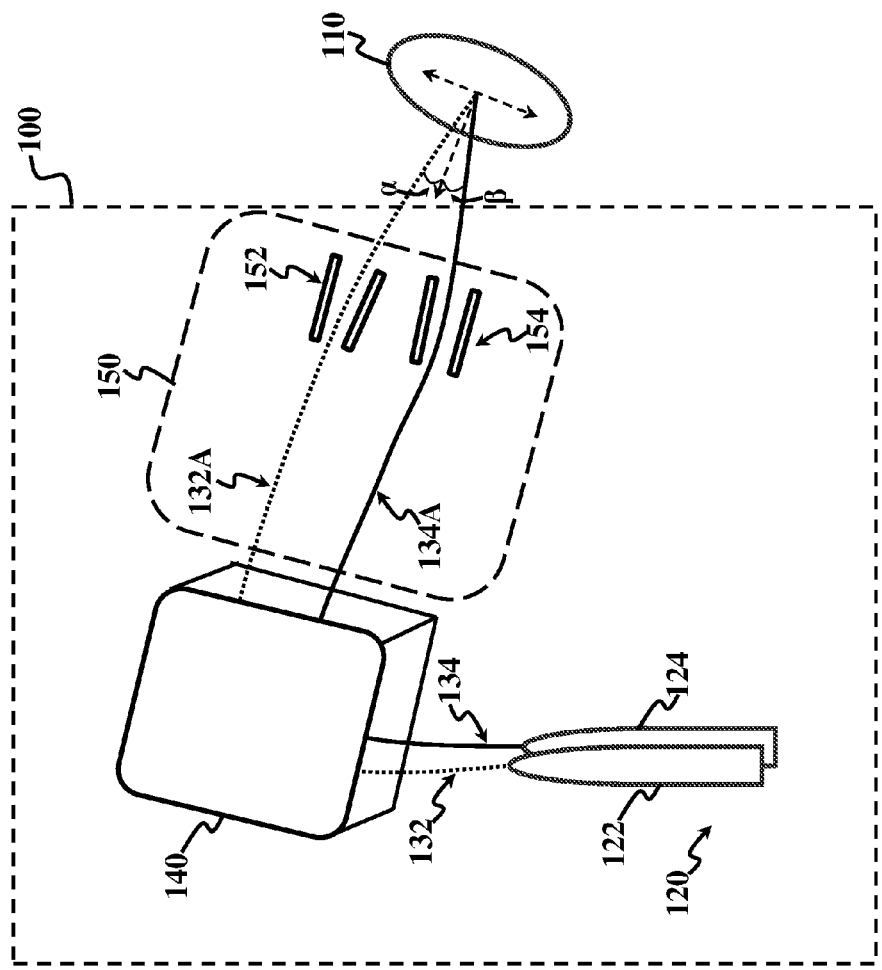
FIG. 1 is a diagrammatic view of a multi-ion beam implantation apparatus that embodies various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic view of a multi-ion beam implantation apparatus 100 that embodies various aspects of the present disclosure. FIG. 1 is not a comprehensive diagram of the entire multi-ion beam implantation apparatus 100. Instead, for simplicity and clarity, FIG. 1 shows only selected portions of the overall apparatus that facilitate an understanding of aspects of the present disclosure. Additional features can be added in the multi-ion beam implantation apparatus 100, and some of the features described below can be replaced or eliminated for other embodiments of the multi-ion beam implantation apparatus 100.

The multi-ion beam implantation apparatus 100 is configured to simultaneously perform more than one implantation on a wafer 110. In other words, the multi-ion beam implantation apparatus 100 simultaneously directs at least two implantation beams at the wafer 110. The wafer 110 is a substrate (for example, a semiconductor substrate), a mask (also referred to as a photomask or reticle), or any base material on which processing is conducted to provide layers of material to form various features of a device, such as an integrated circuit (IC) device. The wafer 110 is disposed on a wafer stage (not illustrated), which may be configured to move the wafer 110 in any direction relative to the multi-ion beam implantation apparatus 100. For example, the wafer 110 may be moved relative to the multi-ion beam implantation apparatus 100 in a linear motion, rotational motion, other suitable motion (such as tilted at an angle relative to the multi-ion beam implantation apparatus 100), or combination thereof. Alternatively or additionally, the multi-ion beam implantation apparatus 100, or portions of the multi-ion beam implantation apparatus 100, may be configured to move relative to the wafer 110. It is noted that the wafer 110 (and/or wafer stage) may be considered a portion of the multi-ion beam implantation apparatus 100.

The multi-ion beam implantation apparatus 100 includes a multi-ion beam source 120 that emits at least two ion beams. The multi-ion beam source 120 includes more than one ion source, such as an ion source 122 and an ion source 124. In the depicted embodiment, the ion source 122 and the ion source 124 produce ions from a sample material using electron ionization (EI). Alternatively, the ionization technique may be chemical ionization (CI) or atmospheric pressure ionization (API) (for example, electrospray ionization (ESI) or matrix-assisted laser desorption ionization (MALDI)). Both the ion source 122 and the ion source 124 output or deliver their respective resulting ions as an ion beam, respectively ion beam 132 and ion beam 134, to an ion beam analyzer 140. The ion source 122 and the ion source 124 include various elements for delivering the resulting ions, particularly ion beam 132 and ion beam 134, to the ion beam analyzer 140. For example, the ion sources 122 and 124 may each include a not-illustrated focusing lens system, where differential voltages are applied to elements of the focusing lens system to control an intensity of the respective ion beams 132 and 134.

The ion beam analyzer 140 analyzes the ions received from the ion sources 122 and 124 (via ion beams 132 and 134 respectively) and emits ions of an appropriate mass-to-charge ratio (m/z) or mass-to-charge ratios, in the form of ion beam 132A and ion beam 134A. In an example, the ion beam analyzer 140 is a trapping mass analyzer. The trapping mass analyzer accumulates and confines the ions received from the ion source 122 and the ion source 124 within a chamber where they are subjected to electric and/or magnetic fields to pass ions of a particular mass-to-charge ratio. The trapping mass analyzer may be a linear quadrupole ion trap, a three-dimensional (3D) quadrupole ion trap, an ion cyclotron resonance (ICR) mass analyzer, an orbitrap mass analyzer, or other trapping mass analyzer. In another alternative, the ion beam analyzer 140 is a non-trapping (or beam) mass analyzer, such as a quadrupole mass filter. The non-trapping mass analyzer continuously moves the ions received from the ion sources 122 and 124 through the ion beam analyzer 140 and applies various electric and/or magnetic fields to effect the separation of the ions according to their mass-to-charge ratio before passing the ions to other portions of the multi-ion beam implantation apparatus 100. The non-trapping mass analyzer could alternatively be a magnetic sector mass analyzer, a time-of-flight (TOF) mass analyzer, or other non-trapping mass analyzer.

A multi-ion beam incidence angle control system 150 directs the ion beam 132A and ion beam 134A emitted from the ion beam analyzer 140 to the wafer 110, such that the ion beam 132A and the ion beam 134A impinge on the wafer 110 at a desired angle. The multi-ion beam incidence angle control system 150 is configured to maintain separate travel paths for the ion beam 132A and the ion beam 134A. The multi-ion beam incidence angle control system 150 uses electric and/or magnetic fields to control an angle of incidence $\alpha$ of the ion beam 132A on the wafer 110 and an angle of incidence $\beta$ of the ion beam 134A on the wafer 110. In the depicted embodiment, the multi-ion beam incidence angle control system 150 uses electric fields to control the angle of incidence of the ion beams 132A and 134A. For example, a set of electric plates 152 direct the ion beam 132A to the wafer 110 at a desired angle, and a set of electric plates 154 direct the ion beam 134A to the wafer 110 at a desired angle. Each set of electric plates 152 and 154 may include more or less electric plates than those illustrated. The angles of incidence $\alpha$ and $\beta$ are measured from a normal to a surface of the wafer 110. The normal extends in a first direction (perpendicular) to the surface of the wafer 110. The angle of incidence may be tilted in a positive direction or a negative direction from the normal. In the depicted embodiment, the angle of incidence $\alpha$ is substantially equal to the angle of incidence $\beta$, except that the angle of incidence $\alpha$ is tilted in a positive direction from the normal and the angle of incidence $\beta$ is tilted in a negative direction from the normal. In an example, the angle of incidence $\alpha$ may be different than the angle of incidence $\beta$. In an example, the angle of incidence $\alpha$ and the angle of incidence $\beta$ may be tilted in a same direction from the normal, such as both in the positive direction or both in the negative direction from the normal.

The multi-ion beam implantation apparatus 100 can reduce both manufacturing time and costs by simultaneously directing multiple ion beams to a surface of the wafer 110, such that more than one portion of the wafer 110 is implanted at a time. Such manufacturing time can be particularly beneficial as wafer sizes increase, for example, from about 300 mm wafer sizes to about 450 mm wafer sizes and beyond. Different embodiments may have different advantages, and no particular advantage is necessarily required of any embodiment.

Further, the multi-ion beam implantation apparatus 100 may be implemented in a one-dimensional (1D) scanning mode (for example, using a ribbon beam for implanting) or a two-dimensional (2D) scanning mode (for example, using a spot beam for implanting), such that greater processing flexibility and capability may be achieved. The multi-ion beam implantation apparatus 100 may thus further include a mechanism that facilitates 1D scanning, 2D scanning, or both 1D and 2D scanning. It is noted that the multi-ion beam implantation apparatus 100 may implement other charged particle beams other than ion beams, such that the multi-ion beam implantation apparatus 100 may be referred to as a multi-charged particle beam implantation apparatus.

Figure 2:
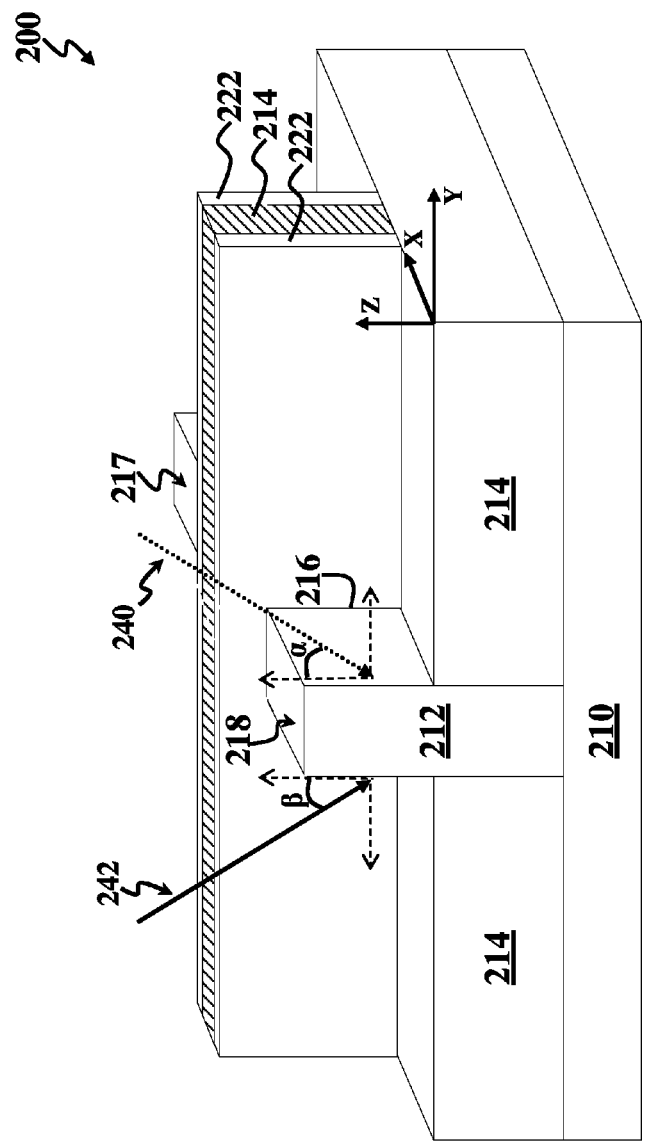
FIG. 2 is a perspective view of a device, in portion or entirety, that includes features that can be formed by using the multi-ion beam implantation apparatus of FIG. 1 according to various aspects of the present disclosure.

FIG. 2 is a perspective view of a device 200, in portion or entirety, that includes features that can be formed by using the multi-ion beam implantation apparatus 100 of FIG. 1 according to various aspects of the present disclosure. In the depicted embodiment, the device 200 is a fin-like field-effect transistor (FinFET) device. The term FinFET device refers to any fin-based, multi-gate transistor. The FinFET device 200 may be included in a microprocessor, memory cell, and/or other integrated circuit device. FIG. 2 has been simplified for the sake of clarity to better understand the inventive concepts of the present disclosure. Additional features can be added in the FinFET device 200, and some of the features described below can be replaced or eliminated in other embodiments of the FinFET device 200.

The FinFET device 200 includes a substrate 210. The substrate 210 is a silicon substrate. Alternatively or additionally, the substrate 210 comprises another elementary semiconductor, such as germanium; a compound semiconductor, such as silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

A fin structure 212, such as a silicon fin, extends from the substrate 210. The fin structure 212 is formed by a suitable process, such as a lithography and etching process. For example, the fin structure 212 may be formed by forming a photoresist layer (resist) overlying the substrate, exposing the resist to a pattern, performing a post-exposure bake process, and developing the resist to form a masking element including the resist. The masking element may then be used to etch the fin structure 212 into the substrate 210. The fin structure 212 may be etched using a reactive ion etch (RIE) and/or other suitable process. Alternatively, the fin structure 212 is formed by a double-patterning lithography (DPL) process. DPL is a method of constructing a pattern on a substrate by dividing the pattern into two interleaved patterns. DPL allows enhanced feature (such as fin) density. Various DPL methodologies may be used including double exposure (for example, using two mask sets), resist freezing, and/or other suitable processes.

An isolation features 214, such as a shallow trench isolation (STI) structure or a local oxidation of silicon (LOCOS) structure, surrounds the fin structure 212 and isolates the fin structure 212 from other not-illustrated fin structures or other features of the FinFET device 200. The isolation feature 214 may be formed by partially filling a trench surrounding the fin structure 212 (for example, formed after the substrate 210 is etched to form the fin structure 212) with an insulating material, such as silicon oxide, silicon nitride, silicon oxynitride, other suitable material, or combinations thereof. The filled trench may have a multi-layer structure, for example, a thermal oxide liner layer with silicon nitride filling the trench.

A gate structure 214 traverses the fin structure 212, and in the depicted embodiment, is formed on a central portion of the fin structure 212. The gate structure 214 surrounds a channel region 216 of the fin structure 212, which is covered in FIG. 2; and the gate structure 214 traverses a source region 217 and a drain region 218 of the fin structure 212, such that the channel region 216 is disposed between the source region 217 and the drain region 218. In an example, the gate structure 214 includes a gate dielectric layer and a gate electrode layer. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The gate electrode layer includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 214 may include other layers, for example, a capping layer, an interface layer, a diffusion layer, a barrier layer, a hard mask layer, or combinations thereof.

Spacers 222 are disposed on sidewalls of the gate structure 214. The spacers 222 are formed by a suitable process to a suitable thickness. For example, a dielectric layer, such as a silicon oxide layer, is blanket deposited over the FinFET device 200; and then, the silicon oxide layer is etched to remove the silicon oxide layer to form the spacers 222 as illustrated in FIG. 2. Alternatively, the spacers 222 include another dielectric material, such as silicon nitride, silicon oxynitride, or combinations thereof.

Implantation, diffusion, and/or annealing processes may be performed to form doped features, such as lightly doped source and drain (LDD) features and/or heavily doped source and drain (HDD) features, in the source region 217 and the drain region 218 of the fin structure 212. In the depicted embodiment, the multi-ion beam implantation apparatus 100 is used to implant dopants in the fin structure 212, such as the drain region 218 of the fin structure 212, thereby forming form doped features in the fin structure 212. The multi-ion beam implantation apparatus 100 can perform a tilt-angle ion implantation process that simultaneously implants opposite sides of the fin structure 212, as illustrated in FIG. 2. For example, in the depicted embodiment, the multi-ion beam implantation apparatus 100 directs ion beam 242 and ion beam 244 on the FinFET device 200, such that the ion beam 242 and the ion beam 244 simultaneously impinge on the fin structure 212. Ion beam 242 and ion beam 244 each implant a dopants (such as n-type dopants, p-type dopants, or combinations thereof) in the fin structure 212. A desired dopant concentration can be achieved by controlling various characteristics of the ion beams 242 and 2444, such as beam geometry, beam energy, focus, angle, other suitable beam characteristic, or combinations thereof.

The ion beam 242 has an angle of incidence α and the ion beam 244 has an angle of incidence β that are measured from a normal to a surface of the FinFET device 200, particularly a surface defined in an X-Y plane. The normal extends in a direction perpendicular to the surface of the FinFET device, such that the normal extends in a Z-direction from the surface defined in the X-Y plane. In the depicted embodiment, the ion implantation performed by the multi-ion beam implantation apparatus 100 implements a tilt angle ion implantation, such that the angle of incidence α is in a positive direction (y-direction) with respect to the normal (z-direction) and the angle of incidence β is in a negative direction (y-direction) with respect to the normal (z-direction). In an example, the angle of incidence α is substantially equal to the angle of incidence β, except that the angle of incidence α is tilted in a positive direction (on a y-axis) from the normal (z-axis) and the angle of incidence β is tilted in a negative direction (on a y-axis) from the normal (z-axis). For example, the angle of incidence α is about +7°, and the angle of incidence β is about −7°. In an example, the angle of incidence α may be different than the angle of incidence β. In an example, the angle of incidence α and the angle of incidence β may be tilted in a same direction from the normal, such as both in the positive direction or both in the negative direction from the normal.

By using more than one ion beam to implant the fin structure 212, processing efficiency can be significantly improved. Typically, each implant is performed separately, such that a first ion beam is used to implant a portion of a device, such as one side of a source/drain region of a fin structure, and then a second ion beam is used to implant another portion of the device, such as another side of the source/drain region of the fin structure. This leads to an extra process step, where two separate implantation processes are performed. Using the multi-ion beam implantation apparatus 100 provides for simultaneous implants, so that multiple portions of a device can be implanted at one time. For example, the multi-ion implantation apparatus 100 can be used to dope more than one side of a source/drain region of a fin structure in a single process, such as the drain region 218 of the fin structure 212 in a single process. This can significantly improve implant accuracy and efficiency.

Figure 3:
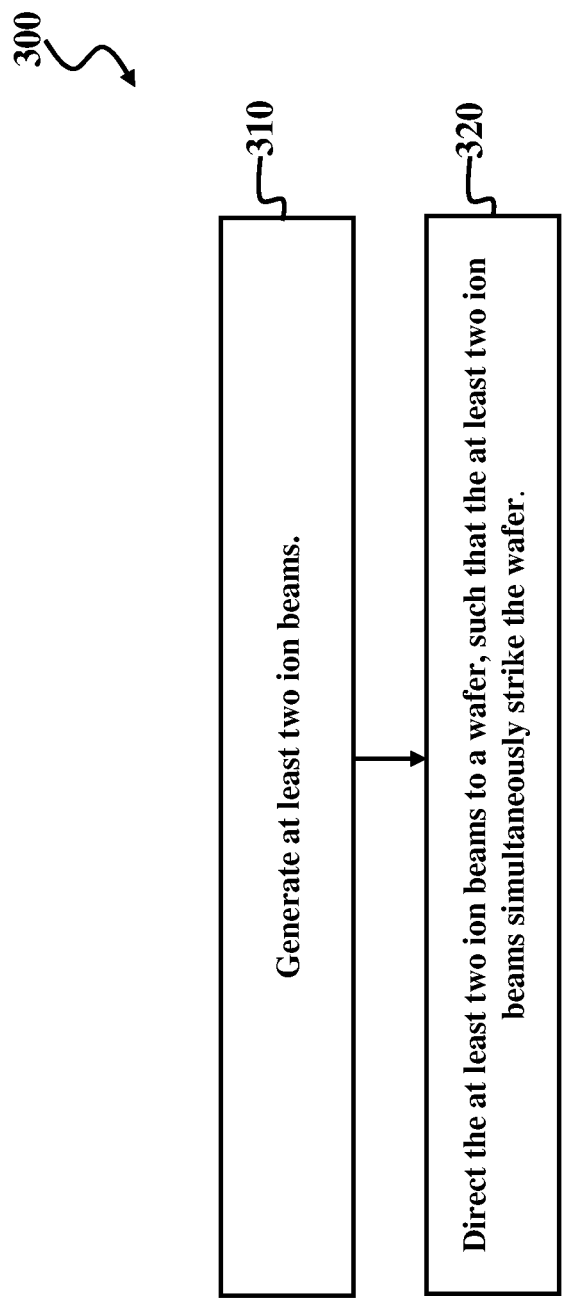
FIG. 3 is a flow chart of a method that can be implemented by the multi-ion beam implantation apparatus of FIG. 1 according to various aspects of the present disclosure.

FIG. 3 is a flow chart of a method 300 that can be implemented by the multi-ion beam implantation apparatus 100 of FIG. 1 according to various aspects of the present disclosure. At block 310, at least two ion beams are generated. For example, referring to the multi-ion beam implantation apparatus 100 above, the ion beam sources 122 and 124 respectively emit ion beams 132 and 134. At block 320, the at least two ion beams are directed to a wafer, such that the at least two ion beams simultaneously strike the wafer. For example, referring to the multi-ion beam implantation apparatus 100, the ion beams 132 and 134 are analyzed by the ion beam analyzer 140, such that the ion beams 132A and 134A are emitted and directed to the wafer 110 by the multi-ion beam incidence angle control system 150. The ion beams 132A and 134A strike the wafer 110, such that more than one portion of the wafer 110 may be simultaneously implanted with a dopant. Additional steps can be provided before, during, and after the method 300, and some of the steps described can be replaced, eliminated, or moved around for additional embodiments of the method 300.

The present disclosure provides for many different embodiments. In an example, an apparatus includes a first charged particle beam source; a second charged particle beam source; an charged particle beam analyzer; and a multi-charged particle beam angle incidence control system disposed between the charged particle beam analyzer and a wafer. The charged particle beam analyzer is configured to analyze a first charged particle beam received from the first charged particle beam source and a second charged particle beam received from the second charged particle beam source, such that the charged particle beam analyzer emits a first analyzed charged particle beam and a second analyzed charged particle beam. The multi-charged particle beam angle incidence control system is configured to direct the first analyzed charged particle beam and the second analyzed charged particle beam to the wafer. The multi-charged particle beam angle incidence control system may direct the first charged particle beam to strike the wafer at a first angle of incidence and direct the second charged particle beam to strike the wafer at a second angle of incidence. In an example, the first angle of incidence is substantially equal to the second angle of incidence; and the first angle of incidence is in a positive direction relative to a normal to the wafer and the second angle of incidence is in a negative direction relative to the normal to the wafer. The first charged particle beam and the second charged particle beam may be ion beams.

The multi-charged particle beam angle incidence control system includes an electric field feature, a magnetic field feature, or a combination thereof for directing the first analyzed charged particle beam and the second analyzed charged particle beam to the wafer. The electric field feature may include a first set of electric plates that directs the first analyzed charged particle beam along a first travel path and a second set of electric plates that directs the second analyzed charged particle beam along a second travel path that is different than the first travel path. The apparatus may further including a one-dimensional (1D) scanning mechanism, such that the first analyzed charged particle beam and the second analyzed charged particle beam are directed to the wafer in a 1D scanning mode. The apparatus may further include a two-dimensional (2D) scanning mechanism, such that the first analyzed charged particle beam and the second analyzed charged particle beam are directed to the wafer in a 2D scanning mode.

In another example, an apparatus includes an ion beam source that emits at least two ion beams; an ion beam analyzer; and a multi-ion beam angle incidence control system, wherein the ion beam analyzer and the multi-ion beam angle incidence control system are configured to direct the emitted at least two ion beams to a wafer. The multi-ion beam angle incidence control system may be direct each of the emitted at least two ion beams to strike the wafer at different angles of incidence. The ion beam source may include a first ion beam source that emits a first ion beam and a second ion beam source that emits a second ion beam. The apparatus may further include a one-dimensional (1D) scanning mechanism, such that the at least two ion beams are directed to the wafer in a 1D scanning mode, or a two-dimensional (2D) scanning mechanism, such that the at least two ion beams are directed to the wafer in a 2D scanning mode. In an example, the at least two ion beams include a first ion beam and a second ion beam; and the multi-ion beam angle incidence control system is configured to direct the first ion beam to strike the wafer at a first angle of incidence and direct the second ion beam to strike the wafer at a second angle of incidence. The first angle of incidence may be substantially equal to the second angle of incidence, where the first angle of incidence is in a positive direction relative to a normal to the wafer and the second angle of incidence is in a negative direction relative to the normal to the wafer.

In yet another example, a method includes generating a first ion beam; generating a second ion beam; and directing the first ion beam and the second ion beam to a wafer, such that the first ion beam and the second ion beam simultaneously strike the wafer, the first ion beam striking the wafer at a first angle of incidence and the second ion beam striking the wafer at a second angle of incidence. In an example, the first angle of incidence may be substantially equal to the second angle of incidence, where the first angle of incidence is in a positive direction relative to a normal to the wafer and the second angle of incidence is in a negative direction relative to the normal to the wafer. Directing the first ion beam and the second ion beam to the wafer may include implanting the wafer to form a doped feature. For example, opposite sides of a source/drain region of a fin structure may be implanted to form the doped feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first charged particle beam source;
   a second charged particle beam source;
   an charged particle beam analyzer configured to analyze a first charged particle beam received from the first charged particle beam source and a second charged particle beam received from the second charged particle beam source, such that the charged particle beam analyzer emits a first analyzed charged particle beam and a second analyzed charged particle beam; and
   a multi-charged particle beam angle incidence control system disposed between the charged particle beam analyzer and a wafer, the multi-charged particle beam angle incidence control system configured to direct the first analyzed charged particle beam and the second analyzed charged particle beam to the wafer at different angles of incidence.

2. The apparatus of claim 1 wherein the first charged particle beam is an ion beam, and the second charged particle beam is an ion beam.

3. The apparatus of claim 1 wherein the multi-charged particle beam angle incidence control system includes an electric field feature for directing the first analyzed charged particle beam and the second analyzed charged particle beam to the wafer.

4. The apparatus of claim 3 wherein the electric field feature includes:
   a first set of electric plates that directs the first analyzed charged particle beam along a first travel path; and
   a second set of electric plates that directs the second analyzed charged particle beam along a second travel path that is different than the first travel path.

5. The apparatus of claim 1 wherein the multi-charged particle beam angle incidence control system includes a magnetic field feature for directing the first analyzed charged particle beam and the second analyzed charged particle beam to the wafer.

6. The apparatus of claim 1 wherein the multi-charged particle beam angle incidence control system includes an electric field feature and a magnetic field feature for directing the first analyzed charged particle beam and the second analyzed charged particle beam to the wafer.

7. The apparatus of claim 1 wherein the multi-charged particle beam angle incidence control system is configured to direct the first charged particle beam to strike the wafer at a first angle of incidence and direct the second charged particle beam to strike the wafer at a second angle of incidence.

8. The apparatus of claim 7 wherein the first angle of incidence is substantially equal to but opposite the second angle of incidence such that the first angle of incidence is in a positive direction relative to a normal to the wafer and the second angle of incidence is in a negative direction relative to the normal to the wafer.

9. The apparatus of claim 1 further including a one-dimensional (1D) scanning mechanism, such that the first analyzed charged particle beam and the second analyzed charged particle beam are directed to the wafer in a 1D scanning mode.

10. The apparatus of claim 1 further including a two-dimensional (2D) scanning mechanism, such that the first analyzed charged particle beam and the second analyzed charged particle beam are directed to the wafer in a 2D scanning mode.

11. An apparatus comprising:
an ion source that emits at least two ion beams;
an ion beam analyzer; and
a multi-ion beam angle incidence control system, wherein the ion beam analyzer and the multi-ion beam angle incidence control system are configured to direct the emitted at least two ion beams to a wafer, wherein the multi-ion beam angle incidence control system is configured to direct each of the emitted at least two ion beams to strike the wafer at different angles of incidence.

12. The apparatus of claim 11 wherein:
the at least two ion beams include a first ion beam and a second ion beam; and
the multi-ion beam angle incidence control system is configured to direct the first ion beam to strike the wafer at a first angle of incidence and direct the second ion beam to strike the wafer at a second angle of incidence.

13. The apparatus of claim 12 wherein the first angle of incidence is substantially equal to but opposite the second angle of incidence such that the first angle of incidence is in a positive direction relative to a normal to the wafer and the second angle of incidence is in a negative direction relative to the normal to the wafer.

14. The apparatus of 11 wherein the ion beam source includes a first ion beam source that emits a first ion beam and a second ion beam source that emits a second ion beam.

15. The apparatus of claim 11 further including a one-dimensional (1D) scanning mechanism, such that the at least two ion beams are directed to the wafer in a 1D scanning mode.

16. The apparatus of claim 11 further including a two-dimensional (2D) scanning mechanism, such that the at least two ion beams are directed to the wafer in a 2D scanning mode.

17. A method comprising:
generating a first ion beam;
generating a second ion beam; and
directing the first ion beam and the second ion beam to a wafer, such that the first ion beam and the second ion beam simultaneously strike the wafer, the first ion beam striking the wafer at a first angle of incidence and the second ion beam striking the wafer at a second angle of incidence, wherein the directing the first ion beam and the second ion beam to the wafer includes implanting opposite sides of a fin structure to form a doped feature in a source/drain region of the fin structure.

18. The method claim 17 wherein:
the first angle of incidence is substantially equal to the second angle of incidence; and
the first angle of incidence is in a positive direction relative to a normal to the wafer and the second angle of incidence is in a negative direction relative to the normal to the wafer.

19. The method of claim 17, wherein the an ion beam source generated the First and second ion beams, and
wherein a multi-ion beam angle incidence control system directs the first ion beam and the second ion beam to the wafer.

20. The method of claim 17, wherein first angle of incidence is different than the second angle of incidence.

* * * * *